United States Patent
Chen

(10) Patent No.: US 8,049,589 B2
(45) Date of Patent: Nov. 1, 2011

(54) BALUN CIRCUIT MANUFACTURED BY INTEGRATE PASSIVE DEVICE PROCESS

(75) Inventor: Chi-Han Chen, Cishan Township, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 12/427,262

(22) Filed: Apr. 21, 2009

(65) Prior Publication Data

US 2010/0060402 A1   Mar. 11, 2010

Related U.S. Application Data

(60) Provisional application No. 61/136,504, filed on Sep. 10, 2008.

(30) Foreign Application Priority Data

Dec. 8, 2008 (TW) ................................ 97147734 A

(51) Int. Cl.
 *H01F 5/00* (2006.01)
 *H01F 27/28* (2006.01)

(52) U.S. Cl. ......... 336/200; 336/192; 336/223; 336/232
(58) Field of Classification Search .................. 336/192, 336/200, 223, 232
See application file for complete search history.

(56) References Cited

U.S. PATENT DOCUMENTS

| 5,793,265 | A | 8/1998 | Spielman |
| 6,097,273 | A | 8/2000 | Frye et al. |
| 6,577,219 | B2 * | 6/2003 | Visser ........................... 336/200 |
| 6,798,326 | B2 * | 9/2004 | Iida ............................... 336/200 |
| 6,927,664 | B2 * | 8/2005 | Nakatani et al. .............. 336/200 |
| 7,129,803 | B2 | 10/2006 | Khorram et al. |
| 7,187,179 | B1 * | 3/2007 | Scaman et al. ................ 324/512 |
| 7,629,860 | B2 | 12/2009 | Liu et al. |
| 2009/0039999 | A1 * | 2/2009 | Fujii et al. ..................... 336/200 |
| 2009/0146770 | A1 * | 6/2009 | Lee et al. ...................... 336/200 |

* cited by examiner

*Primary Examiner* — Anh Mai
*Assistant Examiner* — Ronald Hinson
(74) *Attorney, Agent, or Firm* — Muncy, Geissler, Olds & Lowe, PLLC

(57) ABSTRACT

A Balun circuit manufactured by integrate passive device (IPD) process is provided. The Balun circuit includes a substrate, a first coplanar spiral structure, and a second coplanar spiral structure. At least two first left half coils of the first coplanar spiral structure are electrically connected to the corresponding two first right half coils through a first intersecting structure. At least two second left half coils of the second coplanar spiral structure are electrically connected to the corresponding two second right half coils through a second intersecting structure. The two ends of the second coplanar spiral structure are electrically connected to the innermost second left half coil and the second right half coil respectively. The first left half coils and the second left half coils are interlaced, and so are the first right half coils and the second right half coils interlaced.

15 Claims, 4 Drawing Sheets

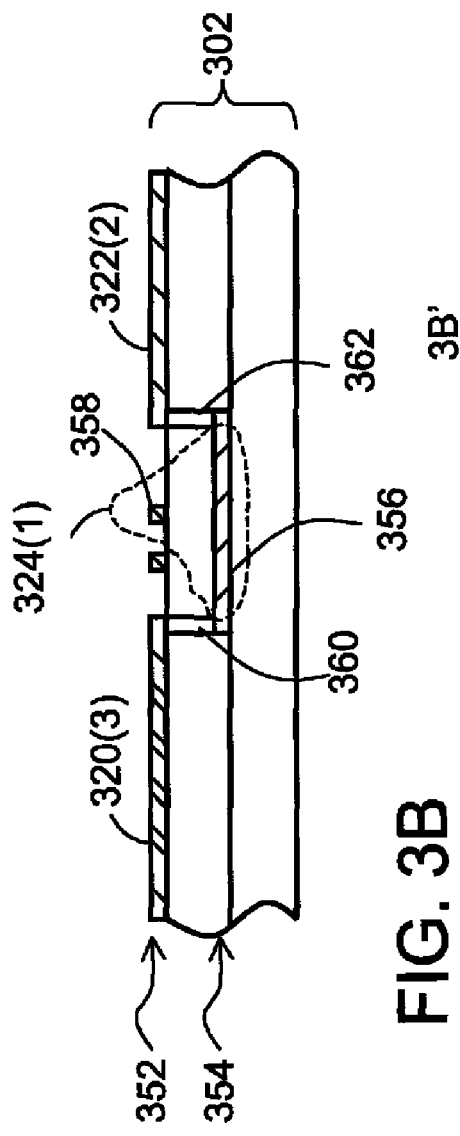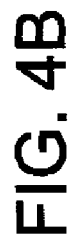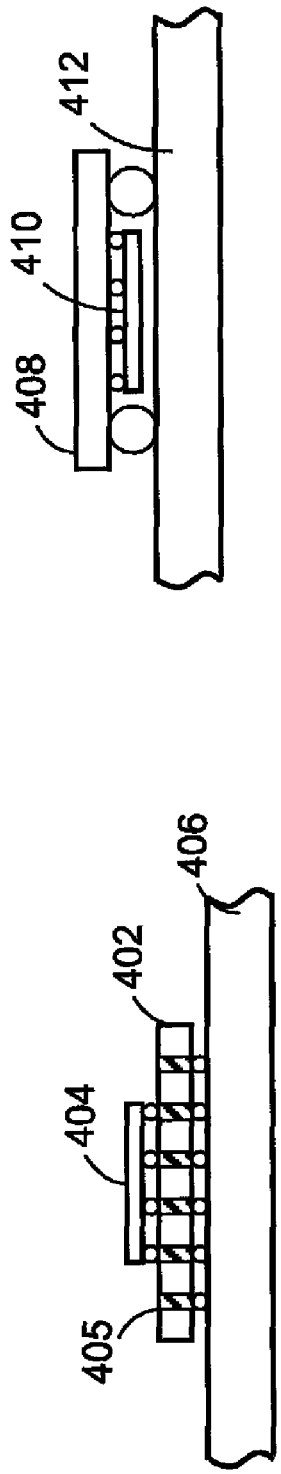

BALUN CIRCUIT MANUFACTURED BY INTEGRATE PASSIVE DEVICE PROCESS

This application claims the benefit of U.S. Provisional application Ser. No. 61/136,504, filed Sep. 10, 2008, and Taiwan application Serial No. 97147734, filed Dec. 8, 2008, the subject matter of which is incorporated herein by reference.

BACKGROUND OF THE INVENTION

1. Field of the Invention

The invention relates in general to a Balun circuit, and more particularly to a Balun circuit manufactured by integrate passive device (IPD).

2. Description of the Related Art

Generally speaking, after a wireless signal is received by the antenna of a communication device, the single-port signal outputted from the antenna will be outputted to a Balun circuit. The Balun circuit will transform the single-port signal into a dual-port signal, and further output the dual-port signal to a radio frequency (RF) transceiver for processing.

One of the currently available Balun circuits is manufactured by low temperature co-fired ceramic (LTCC) process. However, the Balun circuit manufactured by LTCC process must be electrically connected to a substrate through surface-mount technology (SMT) first before the Balun circuit manufactured by LTCC process can be electrically connected to the RF transceiver chip on the substrate. Thus, the substrate must have a reserved region for the disposition of the Balun circuit manufactured by LTCC process and a reserved region for the disposition of the RF transceiver chip. To meet the above requirements, the substrate must have a larger area which occupies a larger space in the communication device. Thus, how to reduce the required area of the substrate so as to save the internal space of the communication device has become one of the important directions to the manufacturers.

SUMMARY OF THE INVENTION

The invention is directed to a Balun circuit manufactured by integrate passive device (IPD) process. The Balun circuit can be directly disposed on a radio frequency (RF) transceiver chip so as to reduce the required area of the substrate and save the internal space for the communication device.

According to a first aspect of the present invention, a Balun circuit manufactured by integrated passive device (IPD) process is provided. The Balun circuit includes a substrate, a first coplanar spiral structure, and a second coplanar spiral structure. The first coplanar spiral structure has a first end, a second end, a first connecting line, a second connecting line, a number of first left half coils, a number of first right half coils, and at least one first intersecting structure. At least two first left half coils are electrically connected to the corresponding two first right half coils through one first intersecting structure. The first end is electrically connected to the outermost first left half coil through the first connecting line. The second end is electrically connected to the outermost first right half coil through the second connecting line. The second coplanar spiral structure has a third end, a fourth end, a third connecting line, a fourth connecting line, a number of second left half coils, a number of second right half coils, and at least one second intersecting structure. At least two second left half coils are electrically connected to the corresponding two second right half coils through one second intersecting structure. The third end is electrically connected to the innermost second left half coil through the third connecting line. The fourth end is electrically connected to the innermost second right half coil through the fourth connecting line. The first left half coils and the second left half coils are interlaced, and so are the first right half coils and the second right half coils interlaced.

The invention will become apparent from the following detailed description of the preferred but non-limiting embodiments. The following description is made with reference to the accompanying drawings.

BRIEF DESCRIPTION OF THE DRAWINGS

FIG. 3B shows a cross-sectional view of the Balun circuit of FIG. 3A along a cross-sectional line 3B-3B';

FIG. 4A shows an example of the disposition relationship between an IPD having the structure of the Balun circuit of the present embodiment of the invention and an RF transceiver chip;

FIG. 4B shows another example of the disposition relationship between an IPD having the structure of the Balun circuit of the present embodiment of the invention and an RF transceiver chip;

DETAILED DESCRIPTION OF THE INVENTION

Figure 1:
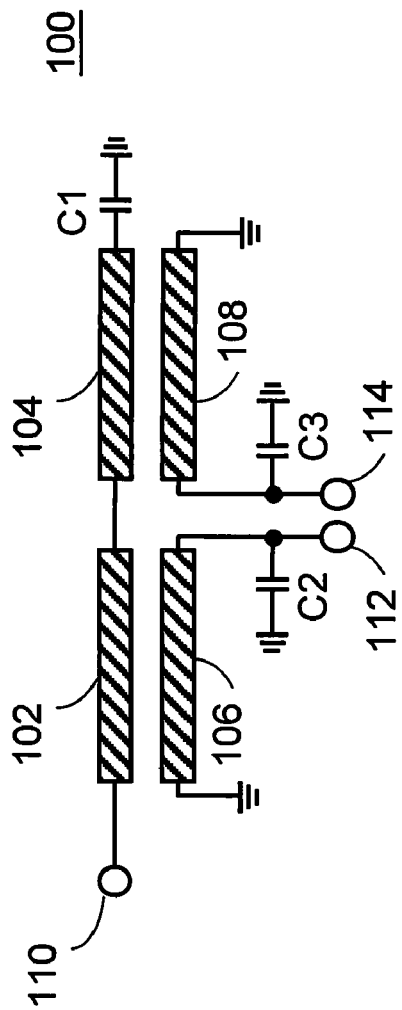
FIG. 1 shows a Balun circuit.

Referring to FIG. 1, a Balun circuit is shown. The Balun circuit includes four transmission lines 102, 104, 106 and 108, and three capacitors C1, C2, and C3. One end of the transmission line 102 is electrically connected to an unbalance port 110, and the other end of the transmission line 102 is electrically connected to the transmission line 104. The other end of the transmission line 104 is grounded through the capacitor C1. One end of the transmission line 106 is grounded, and the other end of the transmission line 106 is electrically connected to the balance port 112 and the capacitor C2. One end of the transmission line 108 is electrically connected to the balance port 114 and the capacitor C3, and one end of the transmission line 108 is grounded.

Figure 2:
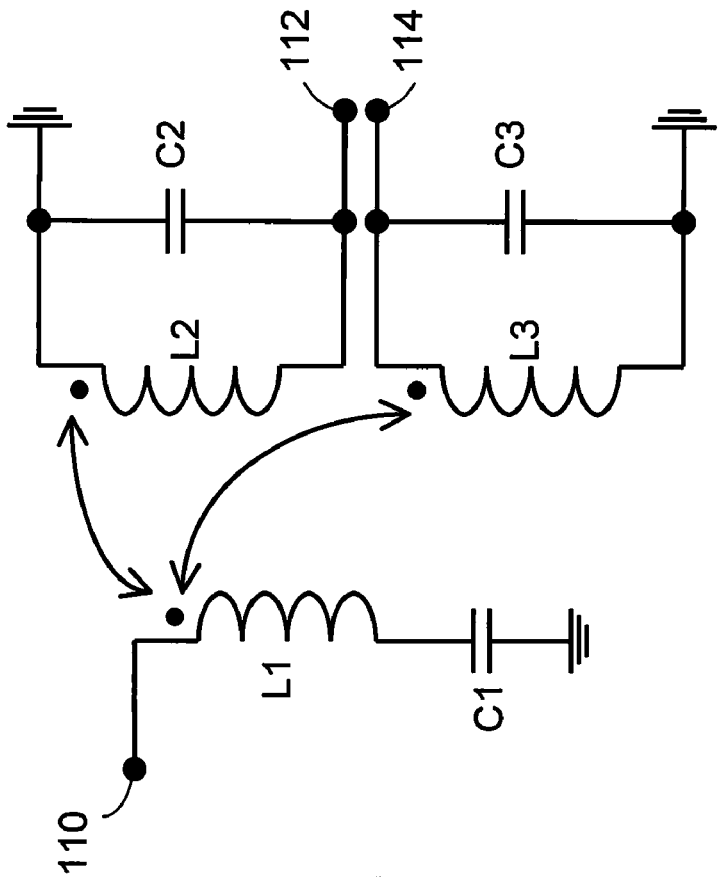
FIG. 2 shows an equivalent circuit diagram of the Balun circuit of FIG. 1.

Referring to FIG. 2, an equivalent circuit diagram of the Balun circuit of FIG. 1 is shown. The transmission lines 102 and 104 can be equivalent to inductance L1, the transmission line 106 can be equivalent to inductance L2, and the transmission line 108 can be equivalent to inductance L3. Through the coupling effect between the inductances L1 and L2 and the coupling effect between the inductances L1 and L3, the single ended signal inputted by the unbalance port 110 is converted into differential signals outputted by the balance ports 112 and 114. The signals outputted by the balance ports 112 and 114 have the same amplitude, but the phases of the two signals are differed by 180 degrees.

The capacitors C1, C2 and C3 disclosed above are used for adjusting the bandwidth of the passband, adjusting the insertion loss, or executing impedance transformation.

Figure 3A:
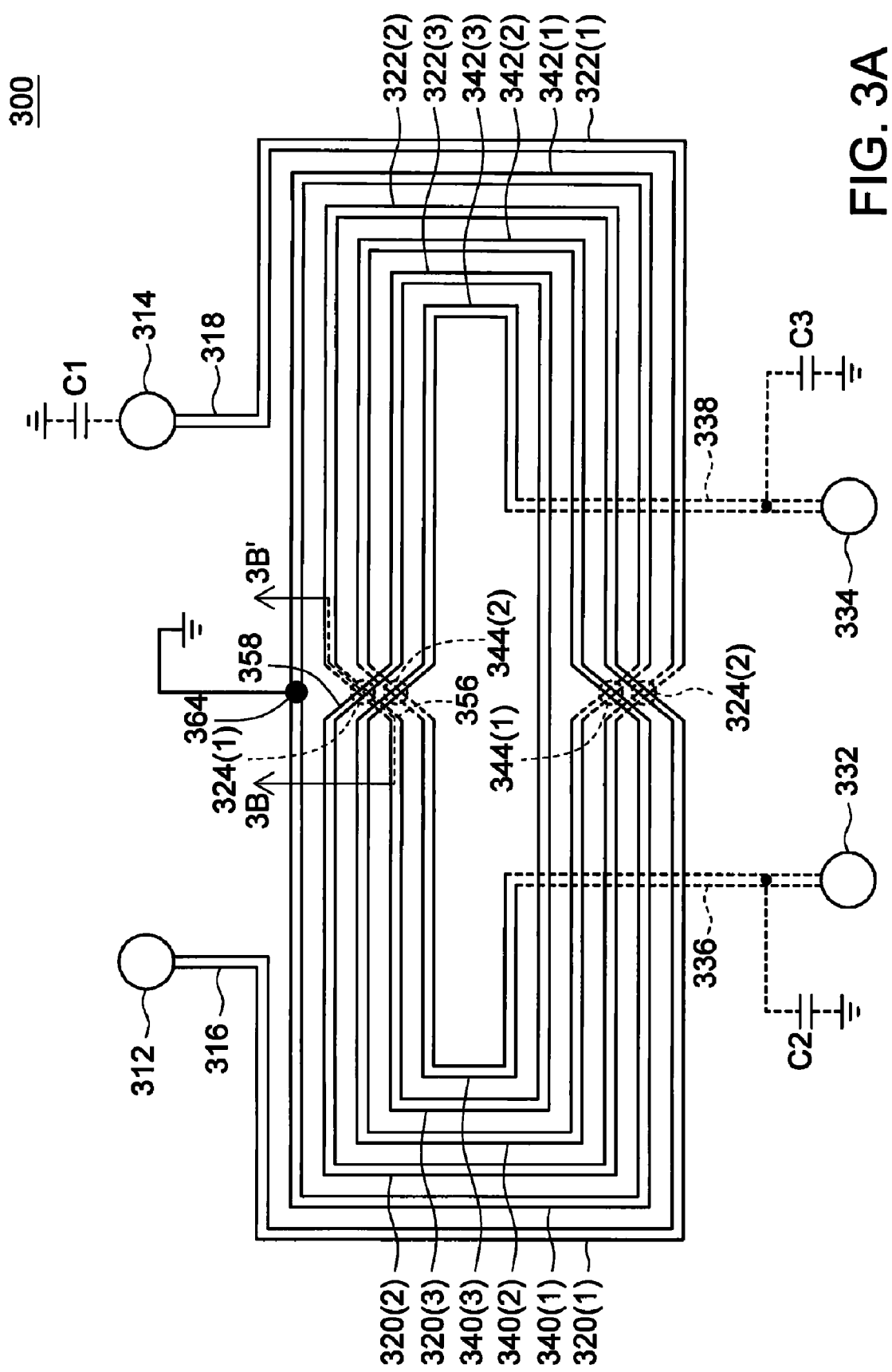
FIG. 3A shows a structure of Balun circuit manufactured by integrate passive device (IPD) process according to an embodiment of the invention.

Referring to both FIG. 3A and FIG. 3B. FIG. 3A shows a structure of Balun circuit manufactured by integrate passive device (IPD) process according to an embodiment of the invention. FIG. 3B shows a cross-sectional view of the Balun circuit 300 of FIG. 3A along a cross-sectional line 3B-3B'. The Balun circuit 300 includes a substrate 302, a first coplanar spiral structure, and a second coplanar spiral structure. The first coplanar spiral structure has a first end 312, a second end 314, a first connecting line 316, a second connecting line 318, a number of first left half coils, a number of first right half coils, and at least one first intersecting structure. The first left half coils, for example, include three left half coils 320(1), 320(2) and 320(3). The first right half coils, for example, include three right half coils 322(1), 322(2) and 322(3). The at least one first intersecting structure includes two first intersecting structures 324(1) and 324(2).

In the first coplanar spiral structure, at least two first left half coils are electrically connected to the corresponding two first right half coils through a first intersecting structure. For example, the first left half coil 320(3) is electrically connected to the first right half coil 322(2) through the first intersecting structure 324(1), and the first left half coil 320(2) is also electrically connected to the first right half coil 322(3) through the first intersecting structure 324(1). The first end 312 is electrically connected to the outermost first left half coil 320(1) through the first connecting line 316, and the second end 314 is electrically connected to the outermost first right half coil 322(1) through the second connecting line 318.

The second coplanar spiral structure has a third end 332, a fourth end 334, a third connecting line 336, a fourth connecting line 338, a number of second left half coils, a number of second right half coils, and at least one second intersecting structure. The second left half coils, for example, include three second left half coils 340(1), 340(2) and 340(3). The second right half coils, for example, include three second right half coils 342(1), 342(2) and 342(3). The at least one second intersecting structure, for example, includes two second intersecting structures 344(1) and 344(2).

In the second coplanar spiral structure, at least two second left half coils are electrically connected to the corresponding two second right half coils through one second intersecting structure. For example, the second left half coil 340(1) is electrically connected to the second right half coil 342(2) through the second intersecting structure 344(1), and the second left half coil 340(2) is electrically connected to the second right half coil 342(1) through the second intersecting structure 344(1). The third end 332 is electrically connected to the innermost second left half coil 340(3) through the third connecting line 336, and the fourth end 334 is electrically connected to the innermost second right half coil 342(3) through the fourth connecting line 338.

The first left half coils and the second left half coils are interlaced, and so are the first right half coils and the second right half coils interlaced. For example, the first left half coils and the second left half coils are disposed in the sequence of the first left half coil 320(1), the second left half coil 340(1), the first left half coil 320(2), the second left half coil 340(2), the first left half coil 320(3), the second left half coil 340(3) from outside in. The first right half coils and the second right half coils are disposed in the sequence of the first right half coil 322(1), the second right half coil 342(1), the first right half coil 322(2), the second right half coil 342(2), the first right half coil 322(3), the second right half coil 342(3) from outside in.

Preferably, the first left half coils 320(1)~320(3) and the second left half coils 340(1)~340(3) are inter-spaced at an equal distance. The first right half coils 322(1)~322(3) and the second right half coils 342(1)~342(3) are inter-spaced at an equal distance.

Referring to FIG. 3B, the substrate 302 has a first wire layer 352 and a second wire layer 354. In the first coplanar spiral structure, the first connecting line 316, the second connecting line 318, the first left half coils 320(1)~320(3), and the first right half coils 340(1)~340(3) are disposed on the first wire layer 352. A part of the first intersecting structure 324(1) is disposed on the first wire layer 352, and the other part of the first intersecting structure 324(1) is disposed on the second wire layer 354. Likewise, a part of the first intersecting structure 324(2) is also disposed on the first wire layer 352, and the other part of the first intersecting structure 324(2) is also disposed on the second wire layer 354.

Let the first intersecting structure 324(1) be taken for example. The first intersecting structure 324(1) includes two wires 356 and 358. The wire 356 is disposed on the second wire layer 354, and the wire 358 is disposed on the first wire layer 352. The first left half coil 320(3), for example, is electrically connected to the wire 356 through the via hole 360, and the wire 356 is electrically connected to the first right half coil 322(2) through the via holes 362. Thus, the first left half coil 320(3) is electrically connected to the first right half coil 322(2) through the wire 356 of the first intersecting structure 324(1).

In the second coplanar spiral structure, the third connecting line 336, and the fourth connecting line 338 are disposed on the second wire layer 354. The second left half coil 340(1)~340(3), the second right half coil 342(1)~342(3) are disposed on the first wire layer 352. A part of the second intersecting structure 344(1) is disposed on the first wire layer 352, and the other part of the second intersecting structure 344(1) is disposed on the second wire layer 354. A part of the second intersecting structure 344(2) is also disposed on the first wire layer 352, and the other part of the second intersecting structure 344(1) is disposed on the second wire layer 354.

Preferably, the length sum of the first left half coils 320(1)~320(3) is substantially equal to that of the first right half coil 322(1)~322(3), and the length sum of the second left half coil 340(1)~340(3) is substantially equal to that of the second right half coil 342(1)~342(3). Thus, when the first end 312 is used as the unbalance port 110 and the third end 332 and the fourth end 334 are respectively used as the balance ports 112 and 114, the third end 332 and the fourth end 334 will output two signals substantially having the same amplitude with the phases being substantially differed by 180 degrees.

As to the connecting point 364 connecting the second left half coil 340(1) to the second right half coil 342(1), the length sum of all half coils at the left side of the connecting point 364 is substantially equal to the length sum of all half coils at the right side of the connecting point 364. The connecting point 364 is connected to a grounding voltage or electrically connected to a direct current voltage supplier (not shown in the drawing) to receive a direct current bias-voltage. The direct current bias-voltage, for example, is determined according to the direct current bias-voltage required by the next level circuit.

As indicated in FIG. 3A, the second end 314, the third end 332 and the fourth end 334 are electrically connected to the capacitors C1, C2 and C3 respectively.

In the Balun circuit 300 of the present embodiment of the invention, the coupling between the first coplanar spiral structure and the second coplanar spiral structure is implemented by way of edge coupling which is less affected by the external reference grounding voltage and achieves a better coupling effect.

The Balun circuit of the present embodiment of the invention only uses two wire layers, and is particularly suitable to be manufactured by IPD process, that is, thin film process.

The Balun circuit manufactured by IPD process has the following characteristics: the wire width and wire distance of the coils can be precisely controlled, and are smaller than that of the conventional Balun circuit manufactured by LTCC process. Compared with the Balun circuit manufactured by LTCC process, the Balun circuit manufactured by IPD process of the present embodiment of the invention further has a reduced layout area.

Referring to FIG. 4A, an example of the disposition relationship between an IPD 402 having the structure of the Balun circuit of the present embodiment of the invention and an RF transceiver chip 404 is shown. The IPD 402 is disposed on the substrate 406, and the RF transceiver chip 404 can be disposed on IPD 402. The RF transceiver chip 404 is electrically connected to the substrate 406 through the via holes 405 of the IPD 402 for example. Thus, compared with the conventional Balun circuit manufactured by LTCC process which must be directly disposed on the substrate for electrically connecting with the RF transceiver chip disposed on other region of the substrate, the IPD 402 of the present embodiment of the invention can save the substrate 406 area.

Referring to FIG. 4B, another example of the disposition relationship between an IPD 408 having the structure of the Balun circuit of the present embodiment of the invention and an RF transceiver chip 410 is shown. The IPD 408 is disposed on the substrate 412, and RF transceiver chip 410 can be disposed in the space under the IPD 408. Such disposition also saves the substrate 412 area.

Figure 5:
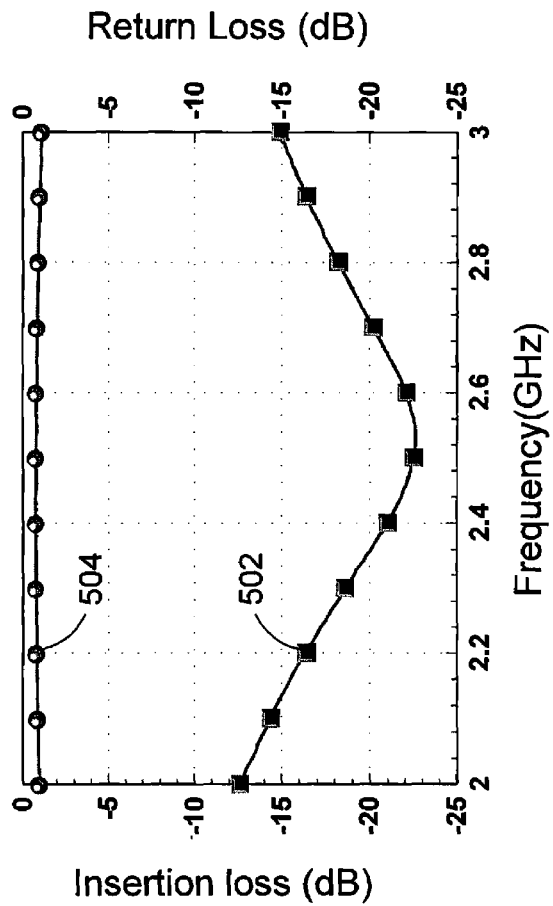
FIG. 5 shows a simulation result of the return loss and the insertion loss for the Balun circuit of the present embodiment of the invention.

Referring to FIG. 5, a simulation result of the return loss and the insertion loss for the Balun circuit of the present embodiment of the invention is shown. Let the first end 312 used as the unbalance port 110 be used as an input port, and let the third end 332 and the fourth end 334 which are used as the balance ports 112 and 114 be now used as output ports, so that dual-port Balun circuit is simulated. As indicated in the return loss relationship curve 502 and the insertion loss relationship curve 504 of FIG. 5, when the frequency is around 2.5 GHz, the return loss is about −22.5 dB and the insertion loss is about −1 dB. Thus, when the frequency is around 2.5 GHz, the Balun circuit 300 of the present embodiment of the invention indeed completes signal transformation.

Figure 6:
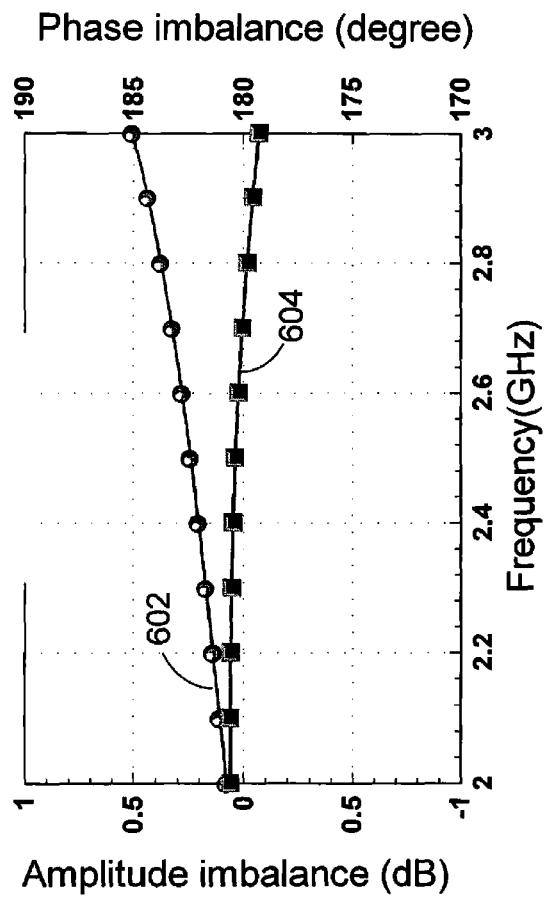
FIG. 6 shows a simulation result for the amplitude imbalance and the phase imbalance of two output signals of the Balun circuit of the present embodiment of the invention.

Referring to FIG. 6, a simulation result for the amplitude imbalance and the phase imbalance of two output signals of the Balun circuit of the present embodiment of the invention is shown. As indicated in the amplitude imbalance relationship curve 602 of the output signals of the third end 332 and the fourth end 334, the amplitude imbalance of the two output signals ranges between 0.1 dB and 0.5 dB when the frequency ranges between 2 GHz and 3 GHz. As indicated in the phase imbalance relationship curve 604 of the output signals of the third end 332 and the fourth end 334, the phase imbalance of the two output signals ranges between 179 degrees and 181 degrees. Thus, the Balun circuit of the present embodiment of the invention is conformed to the requirements of the Balun circuit that the amplitude of the two output signals are substantially the same, and the phase imbalance is substantially 180 degrees.

The above disclosure is exemplified by the Balun circuit 100 having three capacitors C1, C2 and C3, however the Balun circuit 100 can do without the capacitors C1, C2 and C3.

As the Balun circuit manufactured by IPD process of the invention has the characteristics of reducing layout area and saving substrate area, it is conducive for the communication device using the same to achieve lightweight, slimness and compactness and possess even better competiveness.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A Balun circuit manufactured by integrate passive device (IPD) process, the Balun circuit comprises:
    a substrate having a first wire layer and a second wire layer;
    a first coplanar spiral structure having a first end, a second end, a first connecting line, a second connecting line, a plurality of first left half coils, a plurality of first right half coils, and at least one first intersecting structure, wherein at least two first left half coils are electrically connected to the corresponding two first right half coils through one first intersecting structure, the first end is electrically connected to the outermost first left half coil through the first connecting line, the first end is only electrically connected to the first connecting line, and the second end is electrically connected to the outermost first right half coil through the second connecting line; and
    a second coplanar spiral structure having a third end, a fourth end, a third connecting line, a fourth connecting line, a plurality of second left half coils, a plurality of second right half coils, and at least one second intersecting structure, wherein at least two second left half coils are electrically connected to the corresponding two second right half coil through one second intersecting structure, the third end is electrically connected to the innermost second left half coil through the third connecting line, the fourth end is electrically connected to the innermost second right half coil through the fourth connecting line;
    wherein:
    the first left half coils and the second left half coils are interlaced, and so are the first right half coils and the second right half coils interlaced;
    the first end, the second end, the first connecting line, the second connecting line, the first left half coils, the first right half coils, a part of the first intersecting structure, the second left half coil, the second right half coil, a part of the second intersecting structure are disposed on the first wire layer;
    the third end, the fourth end, the other part of the first intersecting structure, the third connecting line, the fourth connecting line, the other part of the second intersecting structure are disposed on the second wire layer;
    the second end is only electrically connected to the second connecting line;
    the third end is only electrically connected to the third connecting line; and
    the fourth end is only electrically connected to the fourth connecting line.

2. The Balun circuit according to claim 1, wherein the first left half coils and the second left half coils are inter-spaced at an equal distance.

3. The Balun circuit according to claim 1, wherein the first right half coils and the second right half coils are inter-spaced at an equal distance.

4. The Balun circuit according to claim 1, wherein the length sum of the first left half coils is substantially equal to that of the first right half coils.

5. The Balun circuit according to claim 1, wherein the length sum of the second left half coils is substantially equal to that of the second right half coils.

6. The Balun circuit according to claim 1, wherein the second end, the third end and the fourth end are electrically connected to a first capacitor, a second capacitor and a third capacitor respectively for adjusting; and
    at least one first left half coil is electrically connected to the corresponding first right half coil through the part of the first intersecting structure; and at least one second left half coil is electrically connected to the corresponding second right half coil through the part of the second intersecting structure.

7. A semiconductor circuit, including:
    a base substrate;
    an integrate passive device (IPD), including a Balun circuit, the Balun circuit comprising:
    a substrate having a first wire layer and a second wire layer;
    a first coplanar spiral structure having a first end, a second end, a first connecting line, a second connecting line, a plurality of first left half coils, a plurality of first right half coils, and at least one first intersecting structure, wherein at least two first left half coils are electrically connected to the corresponding two first right half coils through one first intersecting structure, the first end is electrically connected to the outermost first left half coil through the first connecting line, and the second end is electrically connected to the outermost first right half coil through the second connecting line; and
    a second coplanar spiral structure having a third end, a fourth end, a third connecting line, a fourth connecting line, a plurality of second left half coils, a plurality of second right half coils, and at least one second intersecting structure, wherein at least two second left half coils are electrically connected to the corresponding two second right half coil through one second intersecting structure, the third end is electrically connected to the innermost second left half coil through the third connecting line, the fourth end is electrically connected to the innermost second right half coil through the fourth connecting line, wherein the first left half coils and the second left half coils are interlaced, and so are the first right half coils and the second right half coils interlaced; and
    a chip, electrically connected to the IPD, the chip overlapped with the IPD relative to the base substrate;
wherein:
the first end, the second end, the first connecting line, the second connecting line, the first left half coils, the first right half coils, a part of the first intersecting structure, the second left half coil, the second right half coil, a part of the second intersecting structure are disposed on the first wire layer;
the third end, the fourth end, the other part of the first intersecting structure, the third connecting line, the fourth connecting line, the other part of the second intersecting structure are disposed on the second wire layer;
the first end is only electrically connected to the first connecting line;
the second end is only electrically connected to the second connecting line;
the third end is only electrically connected to the third connecting line; and
the fourth end is only electrically connected to the fourth connecting line.

8. The semiconductor circuit according to claim 7, wherein the chip is electrically connected to the base substrate through a plurality of via holes of the IPD.

9. The semiconductor circuit according to claim 8, wherein the chip is disposed on the IPD.

10. The semiconductor circuit according to claim 8, wherein the chip is disposed in the space under the IPD.

11. The semiconductor circuit according to claim 7, wherein the chip is an RF transceiver chip; and
    at least one first left half coil is electrically connected to the corresponding first right half coil through the part of the first intersecting structure; and at least one second left half coil is electrically connected to the corresponding second right half coil through the part of the second intersecting structure.

12. A Balun circuit manufactured by integrate passive device (IPD) process, the Balun circuit comprises:
    a substrate having a first wire layer and a second wire layer;
    a first coplanar spiral structure having a first end, a second end, a first connecting line, a second connecting line, a plurality of first left half coils, a plurality of first right half coils, and at least one first intersecting structure, wherein at least two first left half coils are electrically connected to the corresponding two first right half coils through one first intersecting structure, the first end is electrically connected to the outermost first left half coil through the first connecting line, and the second end is electrically connected to the outermost first right half coil through the second connecting line; and
    a second coplanar spiral structure having a third end, a fourth end, a third connecting line, a fourth connecting line, a plurality of second left half coils, a plurality of second right half coils, and at least one second intersecting structure, wherein at least two second left half coils are electrically connected to the corresponding two second right half coil through one second intersecting structure, the third end outputting a first signal with a first amplitude and a first phase is electrically connected to the innermost second left half coil through the third connecting line, the fourth end outputting the second signal with a second amplitude and a second phase is electrically connected to the innermost second right half coil through the fourth connecting line;
wherein the first left half coils and the second left half coils are interlaced, and so are the first right half coils and the second right half coils interlaced;
wherein the first amplitude and the second amplitude substantially have the same amplitude, and the first phase and the second phase are substantially differed by 180 degrees;
wherein:
the first end, the second end, the first connecting line, the second connecting line, the first left half coils, the first right half coils, a part of the first intersecting structure, the second left half coil, the second right half coil, a part of the second intersecting structure are disposed on the first wire layer;
the third end, the fourth end, the other part of the first intersecting structure, the third connecting line, the fourth connecting line, the other art of the second intersecting structure are disposed on the second wire layer;
the first end is only electrically connected to the first connecting line;
the second end is only electrically connected to the second connecting line;
the third end is only electrically connected to the third connecting line; and
the fourth end is only electrically connected to the fourth connecting line.

13. The Balun circuit according to claim 12, further including a connecting point connecting to the second left half coil to the second right half coils, wherein the connecting point is connected to a grounding voltage; and at least one first left half coil is electrically connected to the corresponding first right half coil through the part of the first intersecting structure; and at least one second left half coil is electrically connected to the corresponding second right half coil through the part of the second intersecting structure.

14. The Balun circuit according to claim 13, the connecting point is electrically connected to a direct current voltage supplier to receive a first direct current bias-voltage, wherein the first direct current bias-voltage is determined according to a second direct current bias-voltage required by a next level circuit.

15. The Balun circuit according to claim 12, wherein a first length sum of all half coils at a left side of the connecting point is substantially equal to a second length sum of all half coils at a right side of the connecting point.

* * * * *